United States Patent
Hayakawa et al.

(10) Patent No.: US 8,836,065 B2
(45) Date of Patent: Sep. 16, 2014

(54) SOLID-STATE IMAGING DEVICE

(71) Applicant: Kabushiki Kaisha Toshiba, Minato-ku (JP)

(72) Inventors: Jiro Hayakawa, Inagi (JP); Tomoyuki Yoda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/957,878

(22) Filed: Aug. 2, 2013

(65) Prior Publication Data

US 2014/0191347 A1     Jul. 10, 2014

(30) Foreign Application Priority Data

Jan. 8, 2013    (JP) ................. 2013-001198

(51) Int. Cl.
*H01L 31/02*      (2006.01)
*H01L 31/0224*    (2006.01)

(52) U.S. Cl.
CPC ................. *H01L 31/0224* (2013.01)
USPC ......................... 257/435; 257/460

(58) Field of Classification Search
CPC .......... H01L 31/02002; H01L 31/02005; H01L 27/14636
USPC .......................... 257/435, 459, 460
See application file for complete search history.

(56) References Cited

U.S. PATENT DOCUMENTS

| | | |
|---|---|---|
| 2003/0136981 A1 | 7/2003 | Sugiyama |
| 2008/0308890 A1* | 12/2008 | Uya ............................... 257/437 |
| 2010/0096677 A1 | 4/2010 | Inoue |
| 2010/0155796 A1* | 6/2010 | Koike et al. ................... 257/292 |
| 2011/0139962 A1 | 6/2011 | Masaaki |
| 2012/0037960 A1 | 2/2012 | Yokoyama et al. |
| 2013/0119501 A1 | 5/2013 | Yoshida |

FOREIGN PATENT DOCUMENTS

| | | |
|---|---|---|
| JP | 2003-218332 | 7/2003 |
| JP | 2008-311413 | 12/2008 |
| JP | 2010-98219 | 4/2010 |
| JP | 2010-232387 | 10/2010 |
| JP | 2011-129633 | 6/2011 |
| JP | 2012-15470 | 1/2012 |

* cited by examiner

*Primary Examiner* — Daniel Shook
(74) *Attorney, Agent, or Firm* — Oblon, Spivak, McClelland, Maier & Neustadt, L.L.P.

(57) ABSTRACT

According to one embodiment, a solid-state imaging device includes a semiconductor substrate including a pixel area and a peripheral circuit area, an interconnection structure provided on a first principal surface of the semiconductor substrate and including first interconnection layers electrically connected to the peripheral circuit area, a second interconnection layer provided in the peripheral circuit area and on a second principal surface of the semiconductor substrate, a third interconnection layer provided above the second interconnection layer with an insulating layer therebetween, and through electrodes electrically connecting the second interconnection layer to the third interconnection layer.

15 Claims, 24 Drawing Sheets

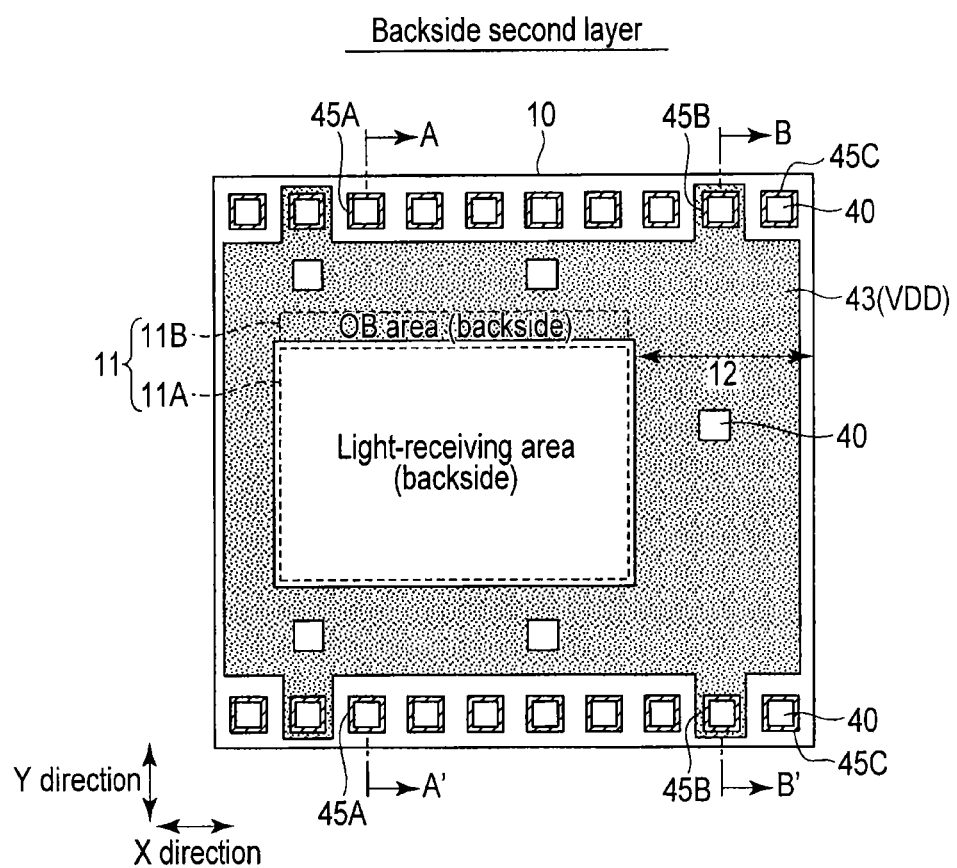
F I G. 3

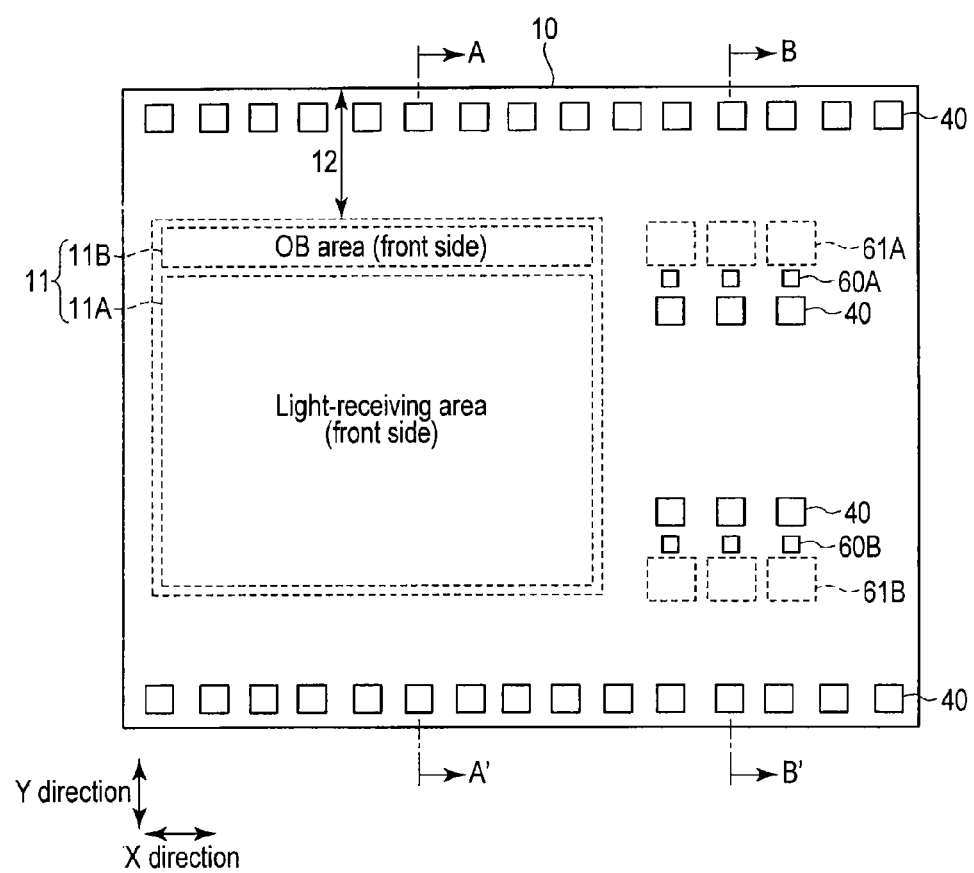
F I G. 13

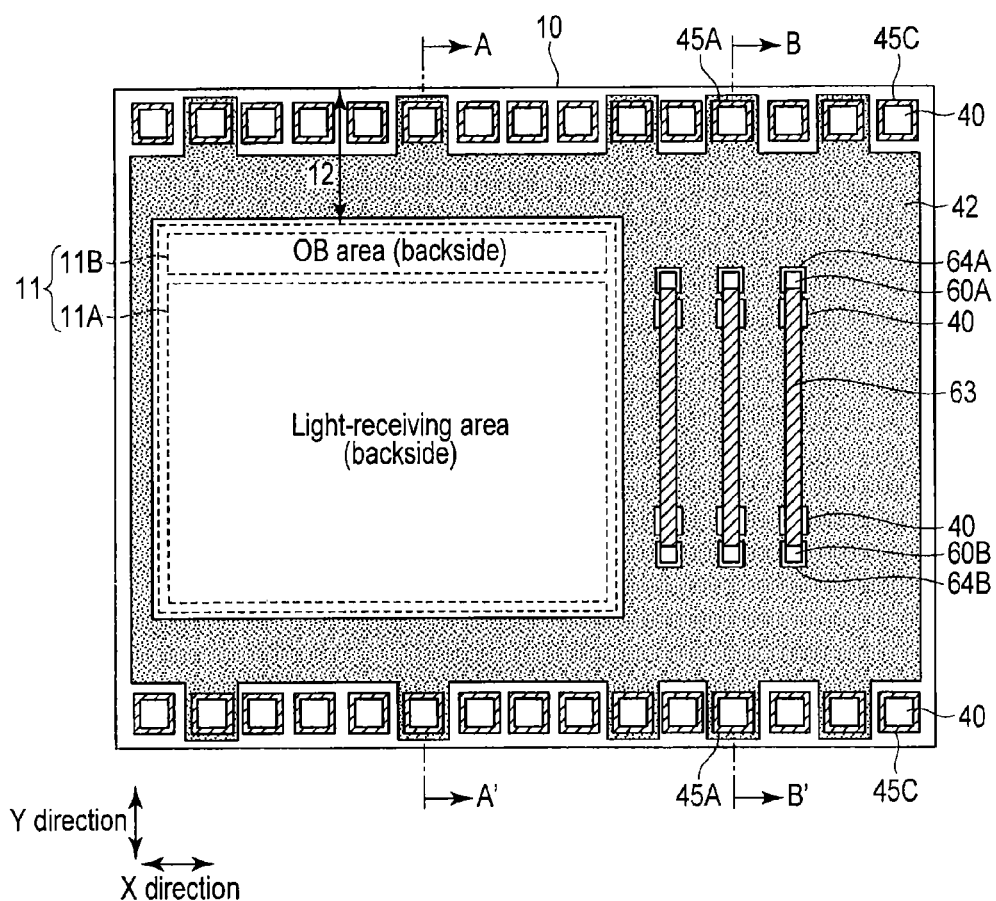
F I G. 14

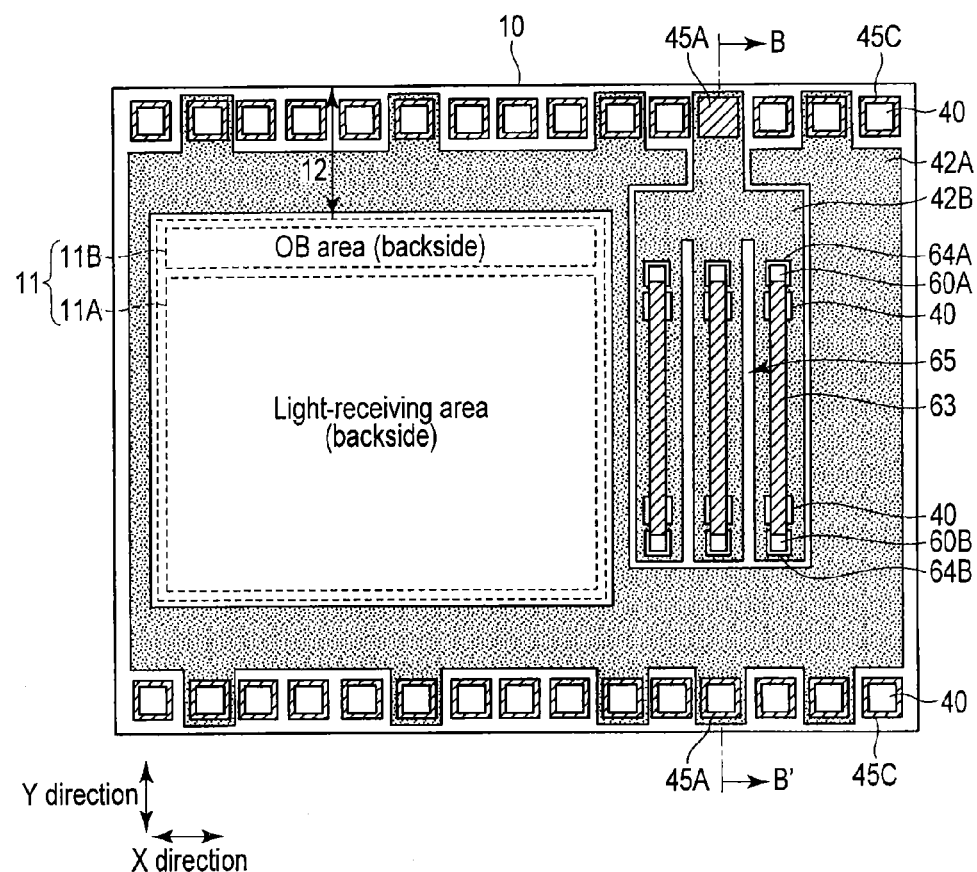
F I G. 17

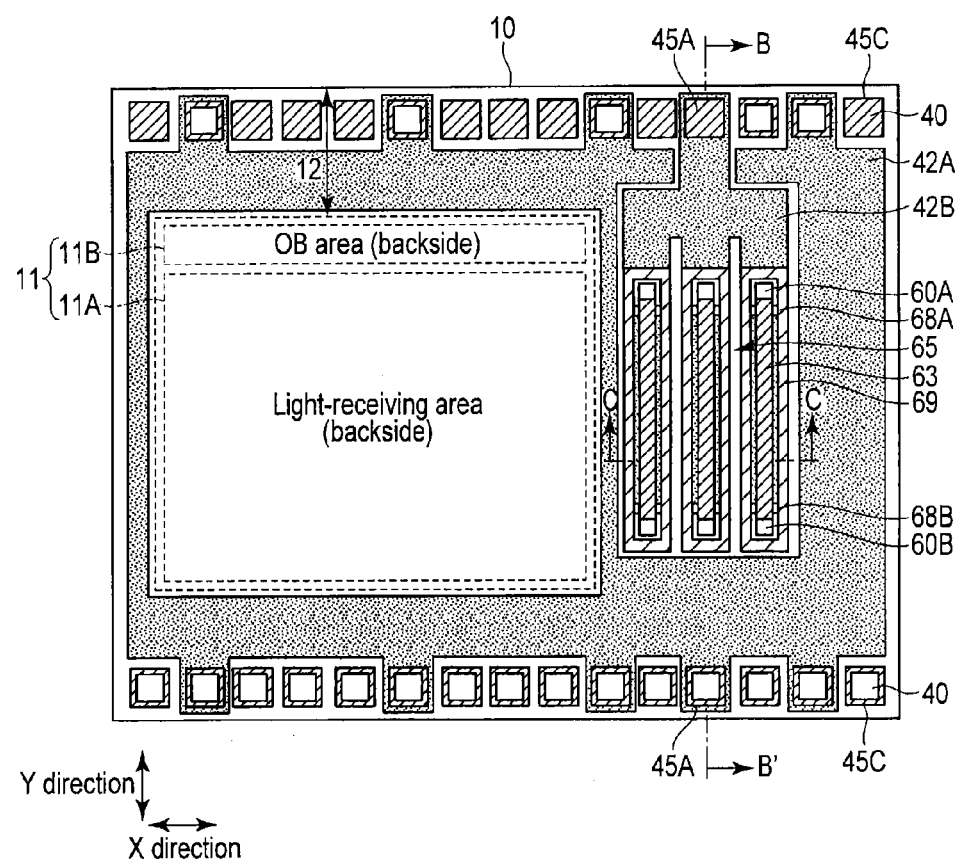
F I G. 22

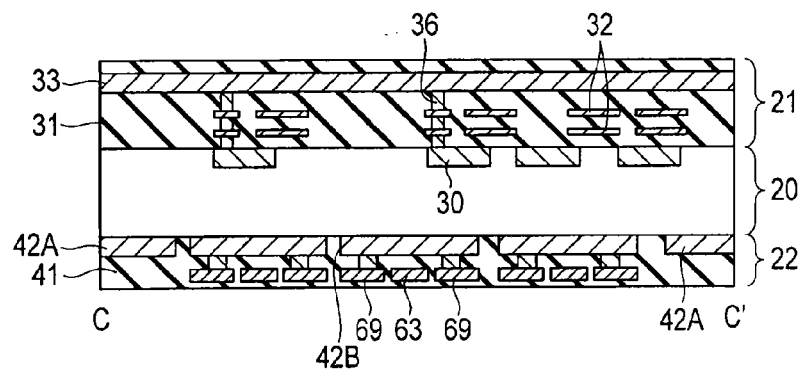
F I G. 24
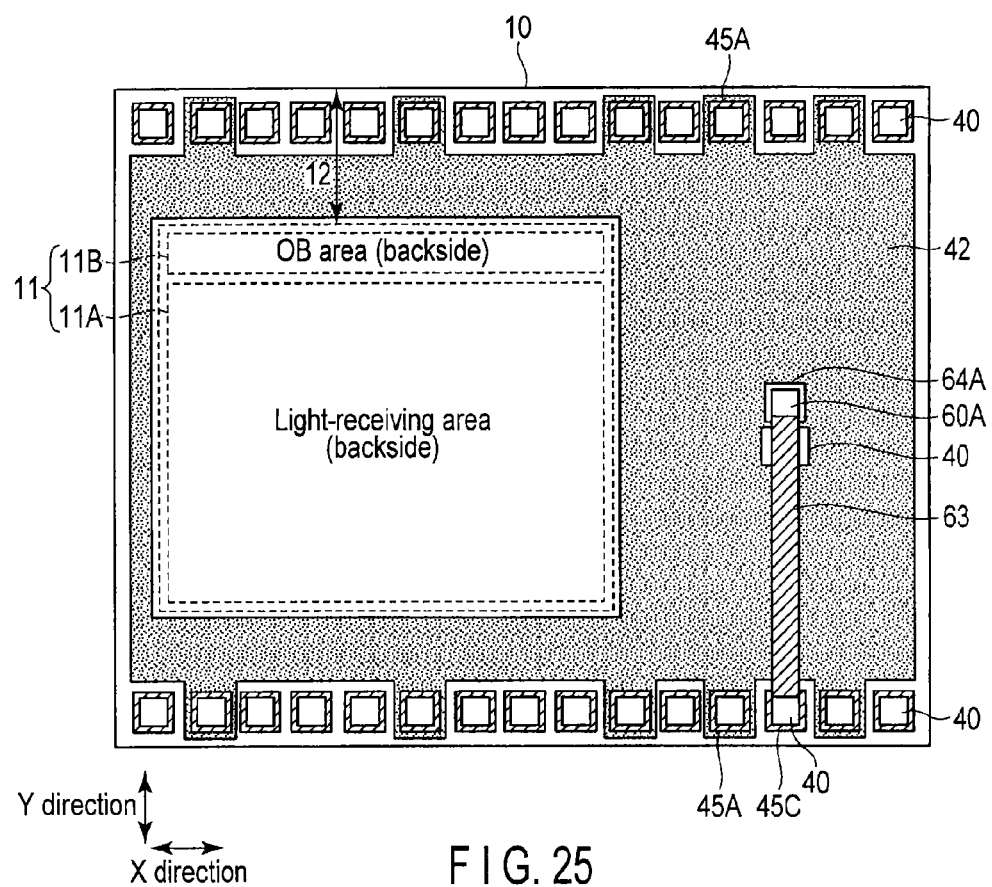
F I G. 25

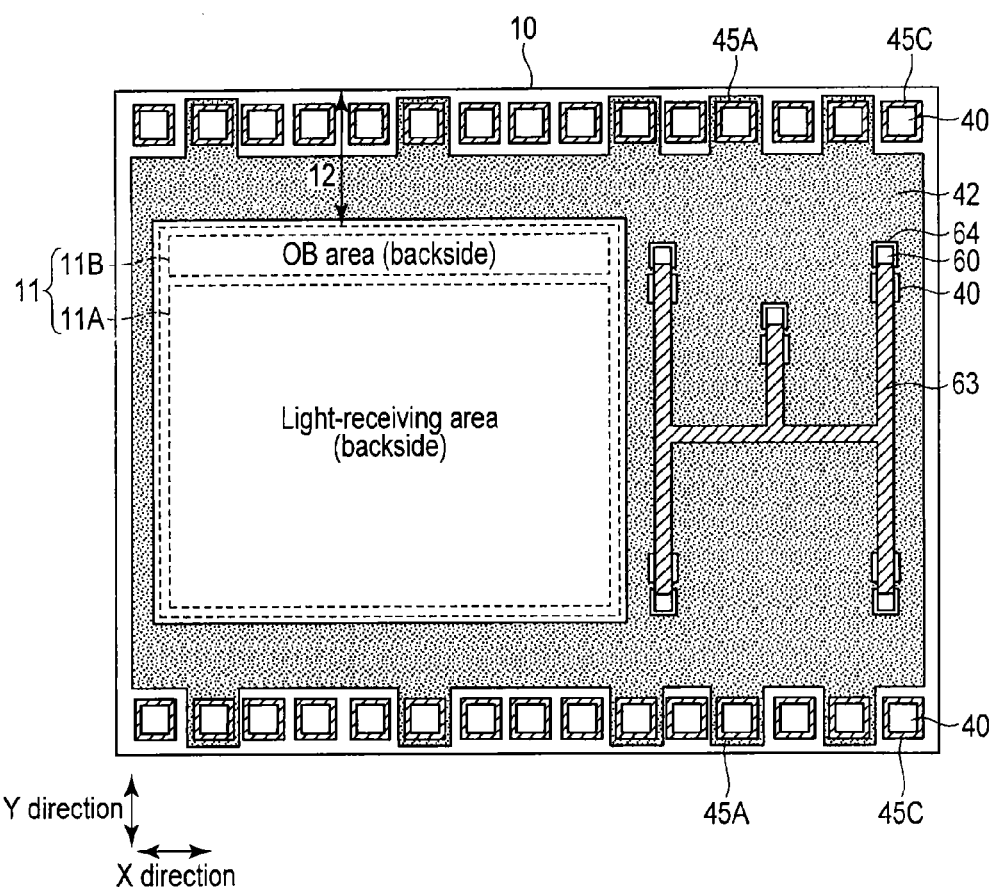
F I G. 26

SOLID-STATE IMAGING DEVICE

CROSS-REFERENCE TO RELATED APPLICATIONS

This application is based upon and claims the benefit of priority from Japanese Patent Application No. 2013-001198, filed Jan. 8, 2013, the entire contents of which are incorporated herein by reference.

FIELD

Embodiments described herein relate generally to a solid-state imaging device.

BACKGROUND

Solid-state imaging devices such as a CCD image sensor and a CMOS image sensor are used in, for example, a digital camera, a video camera and a surveillance camera for various purposes. To address a decrease in pixel size, some of the solid-state imaging devices employ a backside illumination structure that is advantageous for securing an amount of light incident upon a photodiode. A backside illumination solid-state imaging device can be improved in sensitivity and image quality because it excludes an optical obstacle such as a metal interconnection between a light-receiving area and microlenses.

The backside illumination solid-state imaging device comprises a pixel area including light-receiving elements and a peripheral circuit. The peripheral circuit is arranged like, for example, a ring around the pixel area and include a logic circuit and an analog circuit. If a peripheral circuit area is decreased in width to miniaturize the device, it is lengthened, which makes it difficult to provide lines, especially power lines in the peripheral circuit. Thus, the power lines increase in resistance and the power drop of the device becomes great, with the result that the power of the device becomes unstable.

BRIEF DESCRIPTION OF THE DRAWINGS

FIG. 3 is a layout of a backside (second-level layer) of the solid-state imaging device according to the first embodiment;

FIG. 13 is a layout of the front side of a solid-state imaging device according to a fourth embodiment;

FIG. 14 is a layout of the backside of the solid-state imaging device according to the fourth embodiment;

FIG. 17 is a layout of the backside of a solid-state imaging device according to a fifth embodiment;

FIG. 22 is a layout of the backside of the solid-state imaging device according to the seventh embodiment;

FIG. 24 is a sectional view of the solid-state imaging device taken along line C-C' of FIG. 22;

FIG. 25 is a layout of the backside of a solid-state imaging device according to a first modification;

FIG. 26 is a layout of the backside of a solid-state imaging device according to a second modification.

DETAILED DESCRIPTION

Figure 1:
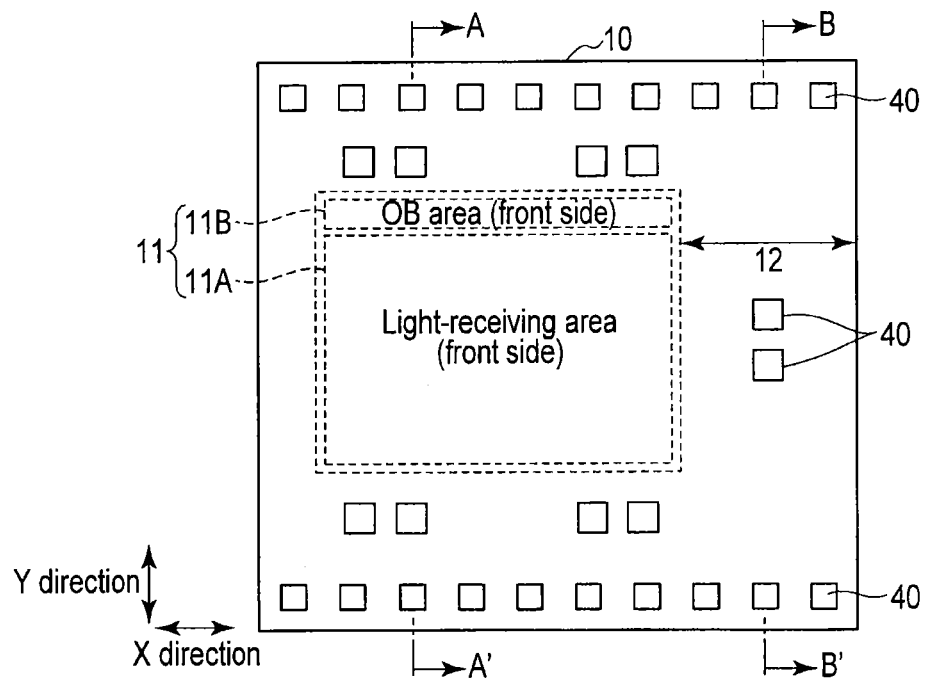
FIG. 1 is a layout of the front side of a solid-state imaging device according to a first embodiment.

In general, according to one embodiment, there is provided a solid-state imaging device comprising:

a semiconductor substrate including a pixel area and a peripheral circuit area and having a first principal surface and a second principal surface;

an interconnection structure provided on the first principal surface of the semiconductor substrate and including first interconnection layers electrically connected to the peripheral circuit area;

a second interconnection layer provided in the peripheral circuit area and on the second principal surface of the semiconductor substrate;

a third interconnection layer provided above the second interconnection layer with an insulating layer therebetween; and through electrodes electrically connecting the second interconnection layer to the third interconnection layer and passing through the semiconductor substrate.

Embodiments will be explained below with reference to the accompanying drawings. Note that these drawings are exemplary or conceptual, so the dimensions and ratios of each drawing are not necessarily the same as real dimensions and ratios. Several embodiments to be described below represent examples of apparatuses and methods for embodying the technical idea of the present invention, and the technical idea of the present invention is not specified by the shapes, structures, and layouts of the constituent parts. Note that in the following explanation, the same reference numerals denote elements having the same functions and arrangements, and a repetitive explanation will be made only when necessary.

First Embodiment

In the first embodiment, a CMOS image sensor having a backside illumination (BSI) structure will be described as an example of a solid-state imaging device.

Figure 2:
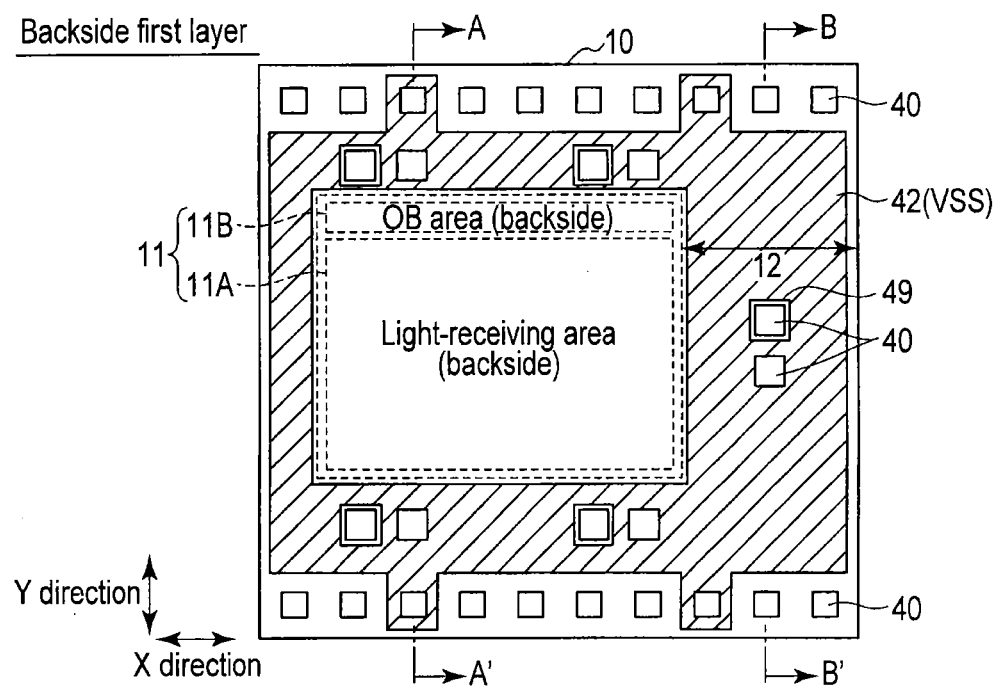
FIG. 2 is a layout of a backside (first-level layer) of the solid-state imaging device according to the first embodiment.
Figure 4:
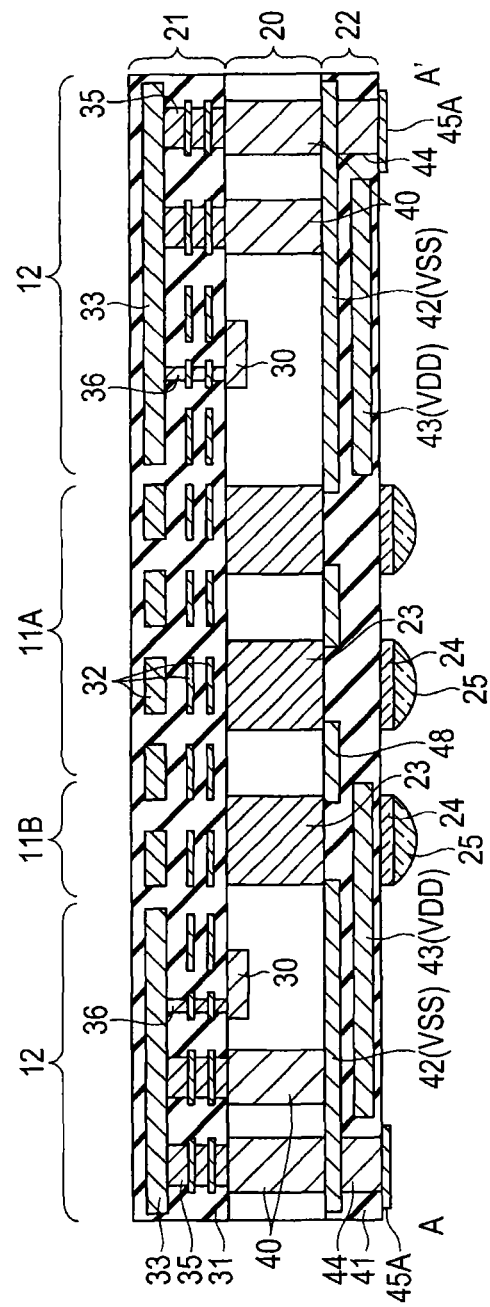
FIG. 4 is a sectional view of the solid-state imaging device taken along line A-A' of FIGS. 1 to 3.
Figure 5:
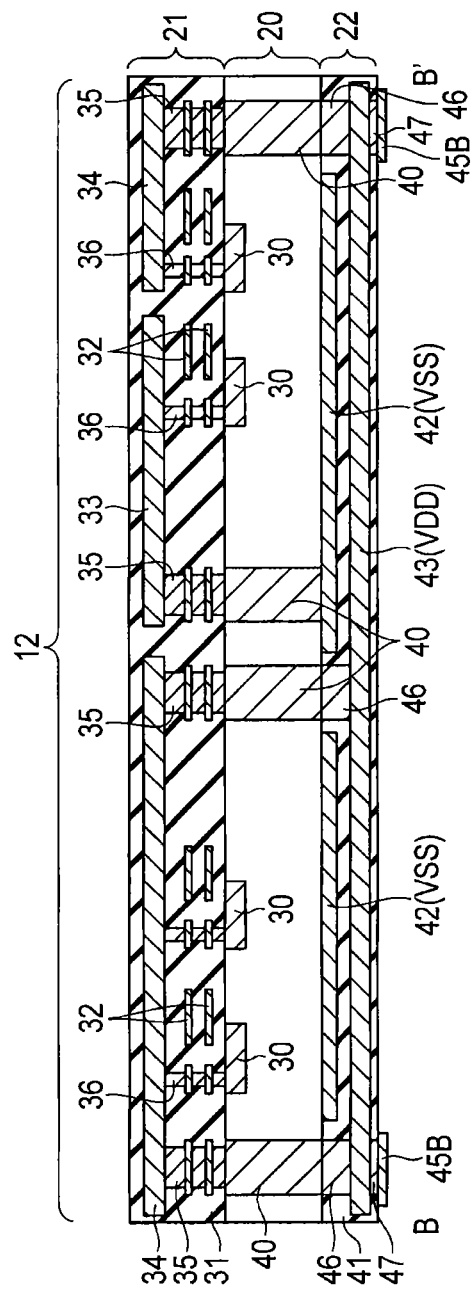
FIG. 5 is a sectional view of the solid-state imaging device taken along line B-B' of FIGS. 1 to 3.

FIG. 1 is a layout of the front side of a solid-state imaging device 10 according to the first embodiment. FIGS. 2 and 3 are layouts of the backside of the solid-state imaging device 10. More specifically, FIG. 2 is a layout mainly showing a first-level interconnection layer on the backside of the device 10 and FIG. 3 is a layout mainly showing a second-level interconnection layer on the backside of the device 10. FIG. 4 is a sectional view of the solid-state imaging device 10 taken along line A-A' of FIGS. 1 to 3. FIG. 5 is a sectional view of the solid-state imaging device 10 taken along line B-B' of FIGS. 1 to 3. The front surface (front side) of the solid-state imaging device 10 corresponds to one of the opposing first and second principal surfaces of a semiconductor substrate on which a semiconductor element is formed. Accordingly, the back surface (backside) of the solid-state imaging device 10 corresponds to the other of the opposing first and second principal surfaces of the semiconductor substrate. In the first embodiment, light enters through the backside of the solid-state imaging device 10.

The solid-state imaging device 10 comprises a pixel area 11 including a pixel unit (pixel array) and a peripheral circuit area 12 including a peripheral circuit for driving and controlling the pixel unit. The pixel area 11 includes a light-receiving area 11A and an optical black area (OB area) 11B. The peripheral circuit area 12 includes an analog circuit and a logic circuit and is formed to surround the pixel area 11, for example.

The solid-state imaging device 10 comprises a semiconductor substrate 20 having a first principal surface (front side) and a second principal surface (backside) opposite to the first principal surface. The semiconductor substrate 20 is formed of a silicon (Si) substrate, for example; however, it can be formed of an epitaxial layer (semiconductor layer) that is made of silicon (Si). A front side interconnection layer 21 is formed on the front surface of the semiconductor substrate 20 and a backside interconnection layer 22 is formed on the back surface of the semiconductor substrate 20. The front side interconnection layer 21 includes a multilevel interconnection layer and an interlayer insulating layer. The backside interconnection layer 22 includes a multilevel interconnection layer, a light-shielding film and an interlayer insulating film (planarization layer). The structures of the front side interconnection layer 21 and the backside interconnection layer 22 will specifically be described later.

The pixel area 11 of the semiconductor substrate 20 includes a plurality of light-receiving elements 23. Each of the light-receiving elements 23 is a photoelectric conversion element that is formed chiefly of a photodiode to convert received light into an electrical signal. A planarization layer (interlayer insulating layer) 41 is formed on the back surface of the semiconductor substrate 20. A plurality of color filters 24 are provided on the planarization layer 41 and a plurality of microlenses 25 are provided on their respective color filters 24. A light-receiving element 23, a color filter 24 and a microlens 25 make up a single light-receiving cell (pixel). A number of light-receiving cells are arranged in array in the pixel area 11 (light-receiving area 11A and optical black area 11B).

In the optical black area 11B, a light-shielding film 43 is formed above the back surface of the semiconductor substrate 20. The light-shielding film 43 shields light from the backside of the substrate. The optical black area 11B is used to measure a dark current of the light-receiving elements. In the first embodiment, the light-shielding film 43 for the optical black area 11B is formed of an interconnection layer included in the backside interconnection layer 22.

In the peripheral circuit area 12, a metal oxide semiconductor filed effect transistor (MOSFET) group 30 including a plurality of MOSFETs is provided in the semiconductor substrate 20. The MOSFET group 30 is combined with a front side signal line to form a peripheral circuit such as a logic circuit and an analog circuit.

The front side interconnection layer 21 is formed on the front surface of the semiconductor substrate 20 and includes an interlayer insulating layer 31, and the multilevel interconnection layer is formed in the interlayer insulating layer 31. The front side interconnection layer 21 includes a plurality of signal lines 32, a plurality of front side VSS lines 33 and a plurality of front side VDD lines 34. These lines are made of metal such as aluminum (Al) and copper (Cu). The front side VSS and VDD lines 33 and 34 are power lines for applying power to the MOSFET group 30. A ground voltage VSS is applied to the front side VSS line 33 and a power supply voltage VDD is applied to the front side VDD line 34. The power supply voltage VDD is, for example, 1.5 V and the ground voltage VSS is, for example, 0 V. The signal lines 32 are connected to the MOSFET group 30 to form a peripheral circuit. The signal lines 32 in the pixel area 11 are connected to the light-receiving elements 23 and the MOSFET group 30 to transfer signals from the light-receiving elements 23 to the peripheral circuit.

A plurality of through electrodes 40 are provided in the peripheral circuit area 12 of the semiconductor substrate 20 to pass through the semiconductor substrate 20. The through electrodes 40 are provided to connect the front side interconnection layer 21 and the backside interconnection layer 22 electrically. The through electrodes 40 are made of a conductive semiconductor into which high-concentration impurities such as polysilicon are doped or metal such as aluminum (Al) and copper (Cu).

The front side VSS lines 33 are each electrically connected to one end of a corresponding through electrode 40 through a via plug 35. Also, the front side VSS lines 33 are each electrically connected to its corresponding MOSFET of the MOSFET group 30 through a via plug 36. Similarly, the front side VDD lines 34 are each electrically connected to one end of a corresponding through electrode 40 through a via plug 35. Also, the front side VDD lines 34 are each electrically connected to its corresponding MOSFET of the MOSFET group 30 through a via plug 36.

In the peripheral circuit area 12, the backside interconnection layer 22 is formed on the back surface of the semiconductor substrate 20 and includes the interlayer insulating layer (planarization layer) 41 and a multilevel interconnection layer formed in the interlayer insulating layer 41. The backside interconnection layer 22 includes a backside VSS line 42 formed of a first-level interconnection layer and a backside VDD line 43 formed of a second-level interconnection layer. In other words, the backside VSS line 42 is formed of a first-level interconnection layer that is the first layer from the semiconductor substrate 20, and the backside VDD line 43 is formed of a second-level interconnection layer that is the second layer from the semiconductor substrate 20. The backside VDD line 43 can be formed of a first-level interconnection layer and the backside VSS line 42 can be formed of a second-level interconnection layer. The backside VSS and VDD lines 42 and 43 are made of metal having imperviousness to light, such as aluminum (Al) and copper (Cu).

As shown in FIG. 2, the backside VSS line 42 is formed in a planar manner to cover the peripheral circuit area 12 and, in other words, the backside VSS line 42 is formed like, for example, a ring to cover the pixel area 11. The backside VSS line 42 has an opening 49 through which a via plug 46 for the backside VDD line 43 passes. The backside VSS line 42 is a power line for applying power to the MOSFET group 30, and a ground voltage VSS is applied to the backside VSS line 42.

The backside VSS line 42 is electrically connected to the other end of the through electrode 40 and thus electrically connected to the front side VSS line 33 via the through electrodes 40. The backside VSS line 42 is electrically connected to a VSS pad 45A provided on the backside interconnection layer 22 through a via plug 44. It is desirable that the through electrodes 40 connected to the backside VSS line 42 should be evenly arranged on the plane of the backside VSS line 42. As shown in FIG. 2, the backside VSS line 42 is connected to the through electrodes 40 in both its end portions in the Y direction and also connected to the through electrodes 40 in the middle portion of the peripheral circuit area 12.

Light-shielding films 48 are provided in the pixel area 11 and between adjacent light-receiving elements 23. The light-shielding film 48 is formed of the same first-level interconnection layer as the backside VSS line 42 and made of the same material as that of the backside VSS line 42. The light-shielding film 48 optically isolates adjacent light-receiving elements 23. Furthermore, the light-shielding film 48 prevents an undesired light beam from entering the light-receiving elements 23 and controls a phase difference between incident light beams.

As illustrated in FIG. 3, the backside VDD line 43 is formed in a planar manner to cover the peripheral circuit area 12 and part (OB area 11B) of the pixel area and, in other words, the backside VDD line 43 is formed like, for example, a ring to cover the light-receiving area 11A included in the pixel area 11. Thus, the backside VDD line 43 is formed to cover the OB area 11B and part of the line 43 is used as a light-shielding film for the OB area 11B. The backside VDD line 43 is a power line for applying power to the MOSFET group 30 and a power supply voltage VDD is applied to the line 43. The backside VDD line 43 (second-level interconnection layer), which is higher than the backside VSS line 42 (first-level interconnection layer) as viewed from the semiconductor substrate 20, is thicker than the backside VSS line 42.

The backside VDD line 43 is electrically connected to the other end of the through electrode 40 through the via plug 46 and thus electrically connected to the front side VDD line 34 through the via plug 46 and the through electrode 40. The backside VDD line 43 is electrically connected to a VDD pad 45B provided on the backside interconnection layer 22 through a via plug 47. It is desirable that the through electrodes 40 connected to the backside VDD line 43 should be evenly arranged on the plane of the backside VDD line 43. As shown in FIG. 3, the backside VDD line 43 is connected to the through electrodes 40 in both its end portions in the Y direction and also connected to the through electrodes 40 in the middle portion of the peripheral circuit area 12.

The signal line 32 included in the front side interconnection layer 21 is electrically connected to a signal pad 45C provided on the backside interconnection layer 22 via the through electrode 40. The signal pad 45C is provided to transmit or receive an electrical signal to or from an external device, and the VSS and VDD pads 45A and 45B are provided to receive power from an external device. The electrode pads (VSS pads 45A, VDD pads 45B and signal pads 45C) are arranged in the peripheral circuit area 12, especially on two of the four sides of the semiconductor substrate 20, namely, both sides of the substrate 20 in the X direction.

(Advantage)

As described in detail above, according to the first embodiment, the interconnection layer (backside interconnection layer) 22 on the back surface of the semiconductor substrate 20 includes two interconnection layers of a first-level interconnection layer and a second-level interconnection layer, and the backside VSS line 42 is formed of the first-level interconnection layer and the backside VDD line 43 is formed of the second-level interconnection layer. Each of the backside VSS line 42 and backside VDD line 43 is formed in a planar manner to cover the peripheral circuit area 12.

According to the first embodiment, therefore, the interconnection resistance of the power lines (VDD lines and VSS lines) can be lowered and accordingly the power of the solid-state imaging device 10 can be stabilized. Furthermore, the capacitance between the VDD and VSS lines can be increased and thus a dynamic voltage drop can be reduced.

The backside VSS and VDD lines 42 and 43 are made of metal having imperviousness to light and the two layers of these lines 42 and 43 cover the entire peripheral circuit area 12. Thus, the MOSFETs of the peripheral circuit area 12 can be shielded from light. When the MOSFETs are irradiated with light, a leakage current is generated from the MOSFETs due to photoelectric conversion. In the first embodiment, however, the MOSFETs of the peripheral circuit area 12 are shielded from light, with the result that the amount of leakage current generated from the MOSFETs can be reduced and accordingly the power consumption of the solid-state imaging device 10 can greatly be reduced.

The backside VSS line 42 is made of the same material as that of the light-shielding film 48 and formed in the same step as the light-shielding film 48. The backside VDD line 43 is made of the same material as that of the light-shielding film of the optical black area 11B and formed in the same step as this light-shielding film. Therefore, even when the backside VSS and VDD lines 42 and 43 are formed on the back surface of the semiconductor substrate 20, the manufacturing costs can be lowered.

Second Embodiment

In the second embodiment, a VSS line and a VDD line are arranged on each of the backside first-level and second-level interconnection layers. Even though these interconnection layers differ in thickness, a difference in interconnection resistance between the VSS and VDD lines is reduced.

Figure 6:
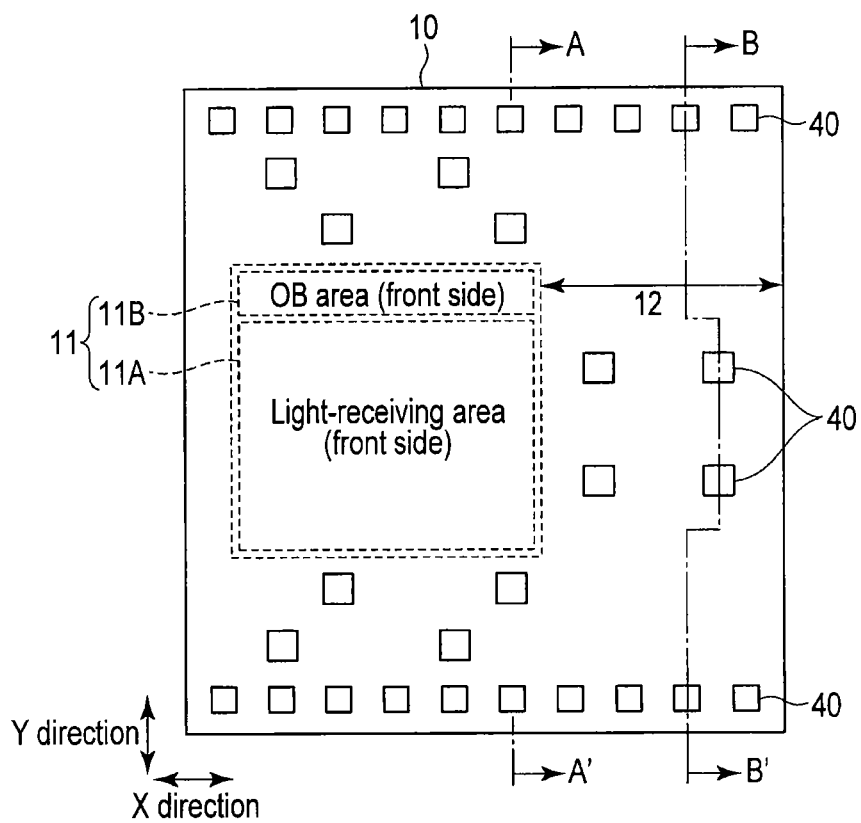
FIG. 6 is a layout of the front side of a solid-state imaging device according to a second embodiment.
Figure 7:
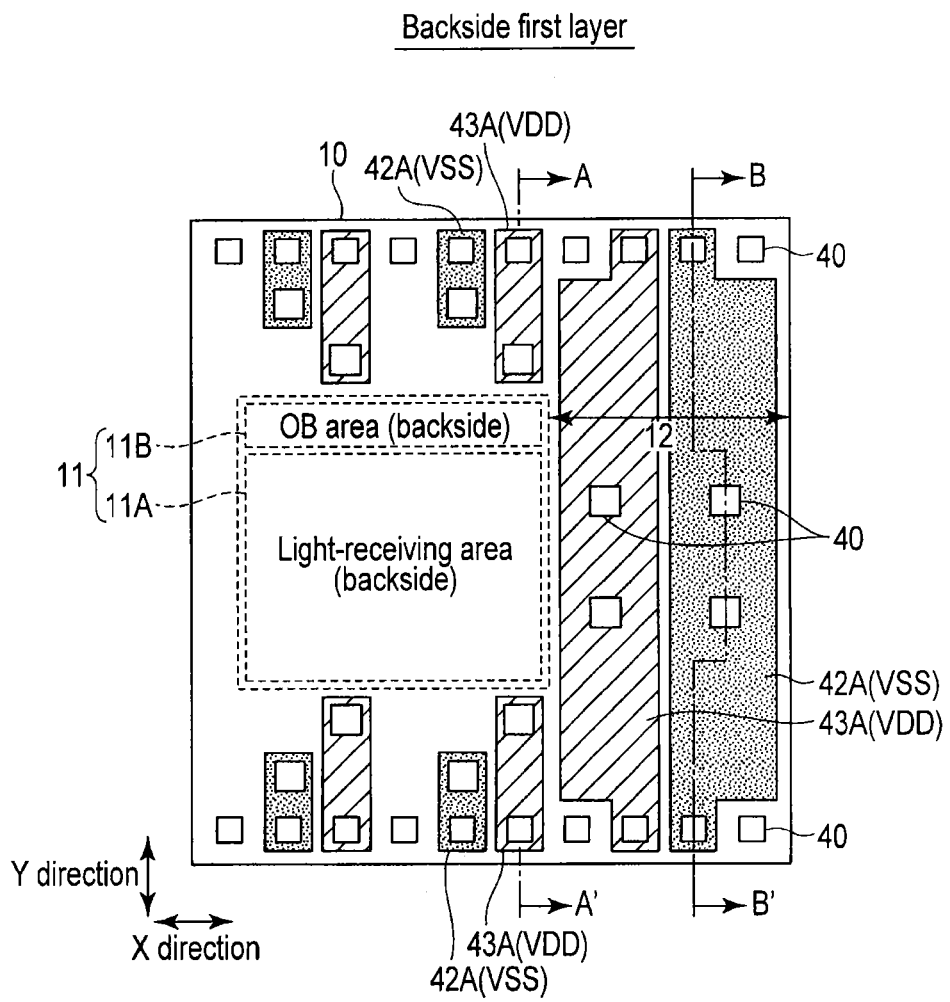
FIG. 7 is a layout of a backside (first-level layer) of the solid-state imaging device according to the second embodiment.
Figure 8:
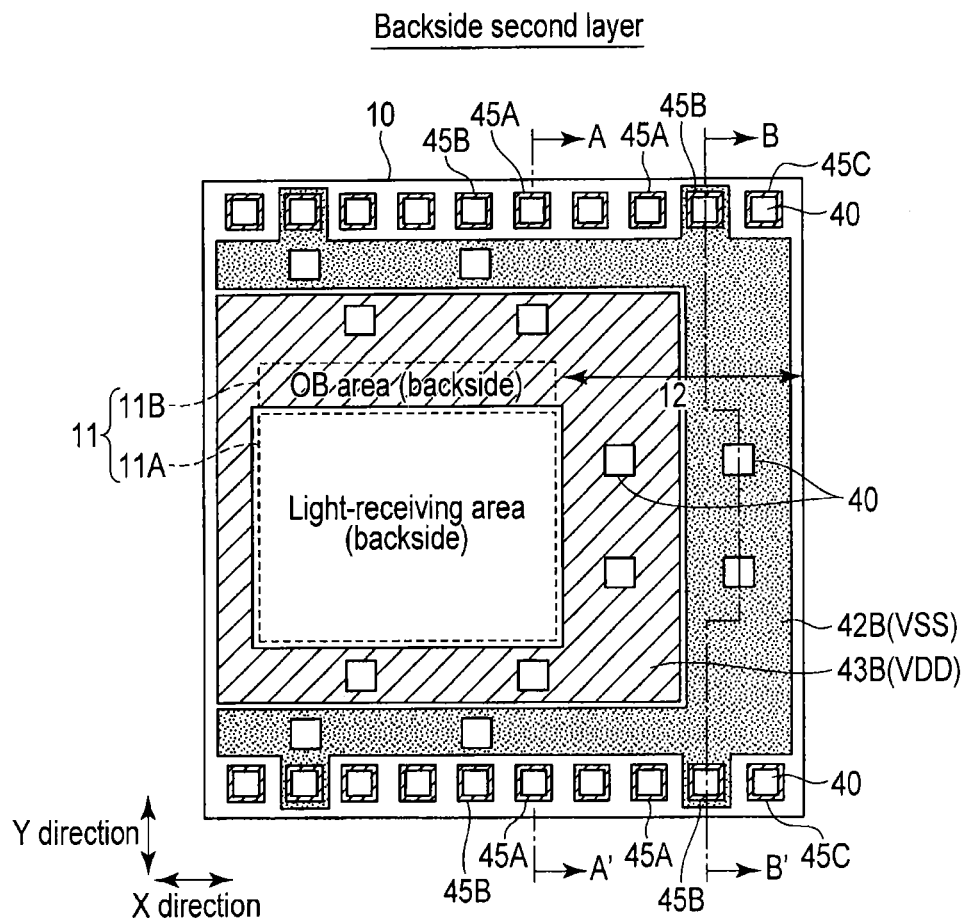
FIG. 8 is a layout of a backside (second-level layer) of the solid-state imaging device according to the second embodiment.
Figure 9:
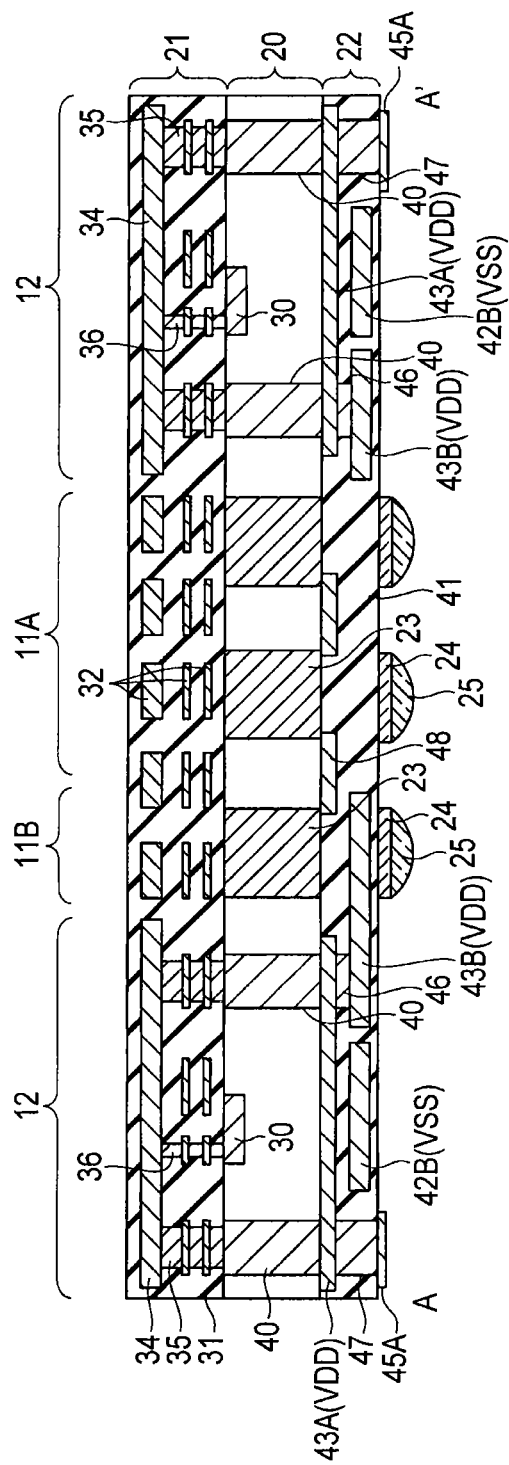
FIG. 9 is a sectional view of the solid-state imaging device taken along line A-A' of FIGS. 6 to 8.
Figure 10:
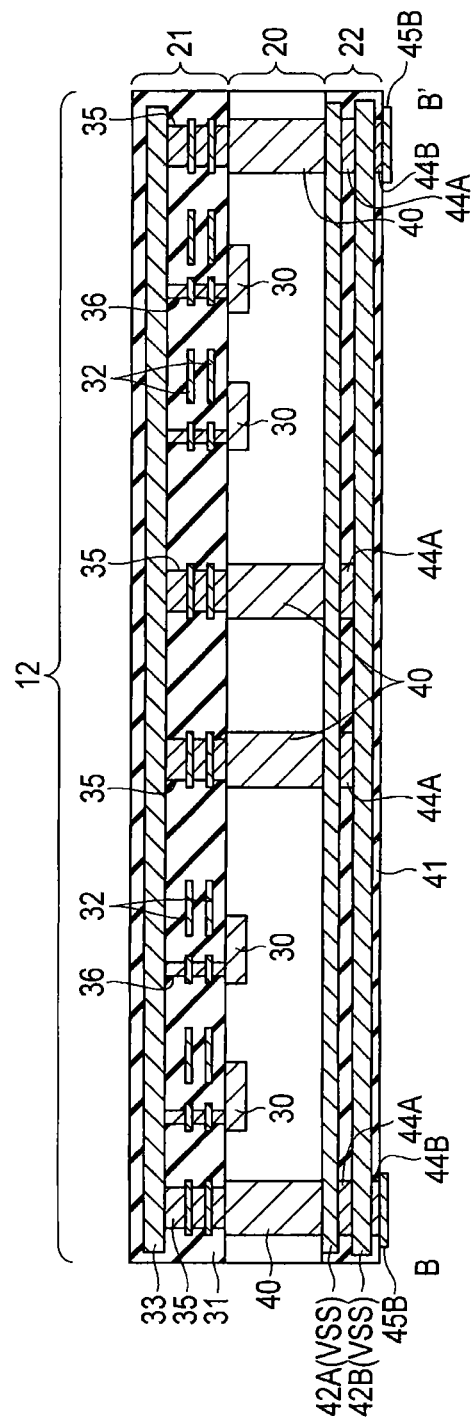
FIG. 10 is a sectional view of the solid-state imaging device taken along line B-B' of FIGS. 6 to 8.

FIG. 6 is a layout of the front side of a solid-state imaging device 10 according to the second embodiment. FIGS. 7 and 8 are layouts of a backside of the solid-state imaging device 10 according to the second embodiment. More specifically, FIG. 7 mainly shows a first-level interconnection layer on the backside of the solid-state imaging device 10 and FIG. 8 mainly shows a second-level interconnection layer on the backside of the solid-state imaging device 10. FIG. 9 is a sectional view of the solid-state imaging device 10 taken along line A-A' of FIGS. 6 to 8. FIG. 10 is a sectional view of the solid-state imaging device 10 taken along line B-B' of FIGS. 6 to 8.

The backside interconnection layer 22 of the second embodiment includes a plurality of backside VSS lines 42A and a plurality of backside VDD lines 43A which are formed of the first-level interconnection layer and a backside VSS line 42B and a backside VDD line 43b which are formed of the second-level interconnection layer. The backside VSS lines 42 (42A and 42B) and the backside VDD lines 43 (43A and 43B) are made of metal having imperviousness to light, such as aluminum (Al) and copper (Cu).

As illustrated in FIG. 7, the backside VSS lines 42A and backside VDD lines 43A, which are formed of the first-level interconnection layer, are linear to extend in the Y direction. In the peripheral circuit area 12 adjacent to the pixel area 11 in the X direction, the backside VSS line 42A is linear to extend in the Y direction from both the end portions of the solid-state imaging device 10, and through electrodes 40 are connected to the end portions and the middle portion of the device 10, and the backside VSS line 42A is electrically connected to a front side VSS line 33 via the through electrodes 40. Likewise, in the peripheral circuit area 12 adjacent to the pixel area 11 in the X direction, the backside VDD line 43A is linear to extend in the Y direction from both the end portions of the solid-state imaging device 10, and through electrodes 40 are connected to the end portions and the middle portion of the device 10, and the backside VDD line 43A is electrically connected to a front side VDD line 34 via the through electrodes 40.

In the peripheral circuit area 12 that is adjacent to the pixel area 11 in the Y direction, the backside VSS line 42A is linear to extend in the Y direction from one end of the solid-state imaging device 10 to a portion under the backside VSS line 42B, and through electrodes 40 are connected to both ends of the backside VSS line 42A. Likewise, in the peripheral circuit area 12 that is adjacent to the pixel area 11 in the Y direction, the backside VDD line 43A is linear to extend in the Y direction from one end of the solid-state imaging device 10 to a portion under the backside VDD line 43B, and through electrodes 40 are connected to both ends of the backside VDD line 43A.

As illustrated in FIG. 8, the backside VDD line 43B is formed like, for example, a ring to cover an OB area 11B and part of the peripheral circuit 12 and surround a light-receiving area 11A. Thus, the backside VDD line 43B is formed to cover the OB area 11B and its part is used as a light-shielding film for the OB area 11B. The backside VDD line 43B is connected to the backside VDD line 43A through a via plug 46 and electrically connected to VDD pads 45B provided on the backside interconnection layer 22 through a via plug 47.

The backside VSS line 42B is formed, for example, concavely to cover part of the peripheral circuit area 12 and surround the backside VDD line 43B. The backside VSS line 42B is connected to the backside VSS line 42A through a via plug 44A and electrically connected to a VSS pad 45A provided on the backside interconnection layer 22 through a via plug 44B.

Figure 11:
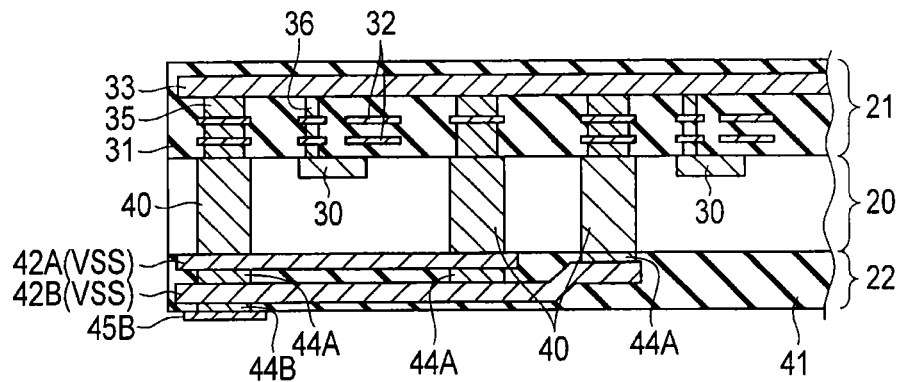
FIG. 11 is a sectional view of a solid-state imaging device according to a modification.

Another example of the structure of a connecting portion between the through electrodes 40 and the backside power line will be described. As shown in FIG. 11, the through electrodes 40 can be connected to the backside VSS line 42B through the via plug 44A in part of the peripheral circuit area 12. In an area where the through electrodes 40 are connected to the backside VSS line 42B through the via plug 44A, for example, the backside VSS line 42B is lowered toward the semiconductor substrate 20 due to a manufacturing step. The backside VDD line 43B can be formed in the same manner as the backside VSS line 42B.

(Advantage)

As described in detail above, according to the second embodiment, even though the backside first-level and second-level interconnection layers differ in thickness, a difference in resistance between the VSS and VDD lines can be reduced, with the result that the power of the solid-state imaging device 10 can be stabilized, in addition to the advantage of the first embodiment.

Third Embodiment

In the second embodiment, a slit is formed between the backside VSS line 42A and the backside VDD line 43A which are formed of the backside first-level interconnection layer and also between the backside VSS line 42B and the backside VDD line 43B which are formed of the backside second-level interconnection layer. When light enters the peripheral circuit area 12 from the slit, a leakage current will be generated from the MOSFETs formed in the peripheral circuit area 12. To prevent this, the third embodiment improves imperviousness to light further by causing the slit formed in the backside first-level interconnection layer and the slit formed in the backside second-level interconnection layer to differ from each other in location.

Figure 12:
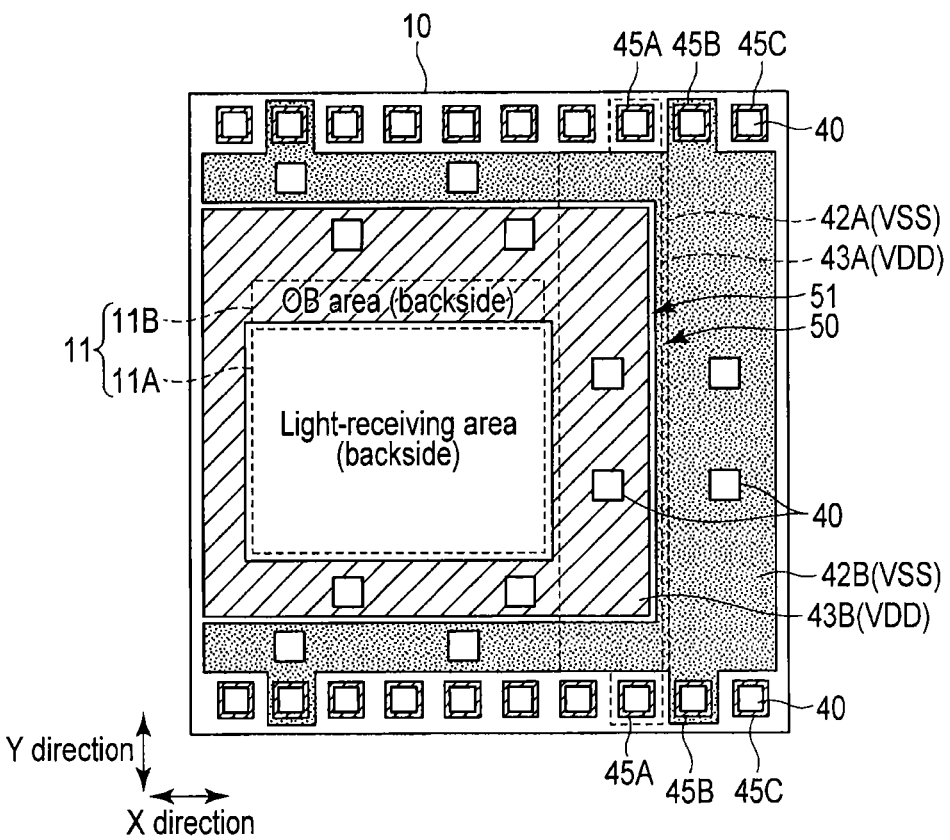
FIG. 12 is a layout of the backside of a solid-state imaging device according to a third embodiment.

FIG. 12 is a layout of the backside of a solid-state imaging device 10 according to the third embodiment. FIG. 12 mainly shows the second-level interconnection layer on the backside of the solid-state imaging device 10.

As shown in FIG. 12, a slit 50 is formed to extend in the Y direction between the backside VSS line 42A and the backside VDD line 43A which are formed of the backside first-level interconnection layer. Furthermore, a slit 51 is formed to extend in the Y direction between the backside VSS line 42B and the backside VDD line 43B which are formed of the backside second-level interconnection layer. The slit 51 is shifted from the slit 50 so as not to overlap the slit 50 in a planar view.

If, as described above, the locations of the slits 50 and 51 are adjusted, light that enters from, for example, the slit 51 is shielded by the first-level interconnection layer (backside VSS line 42A and backside VDD line 43A). Thus, as compared with the second embodiment, light incident upon the peripheral circuit area 12 can be reduced, with the result that a leakage current generated from the MOSFETs formed in the peripheral circuit area 12 can be reduced further.

Fourth Embodiment

In the fourth embodiment, a VSS line is formed of a backside first-level interconnection layer and a signal line is formed of a backside second-level interconnection layer. Therefore, a signal that is transmitted through the signal line is stabilized to reduce the influence of noise generated from a semiconductor element (active element) on the surface of a semiconductor substrate.

Figure 15:
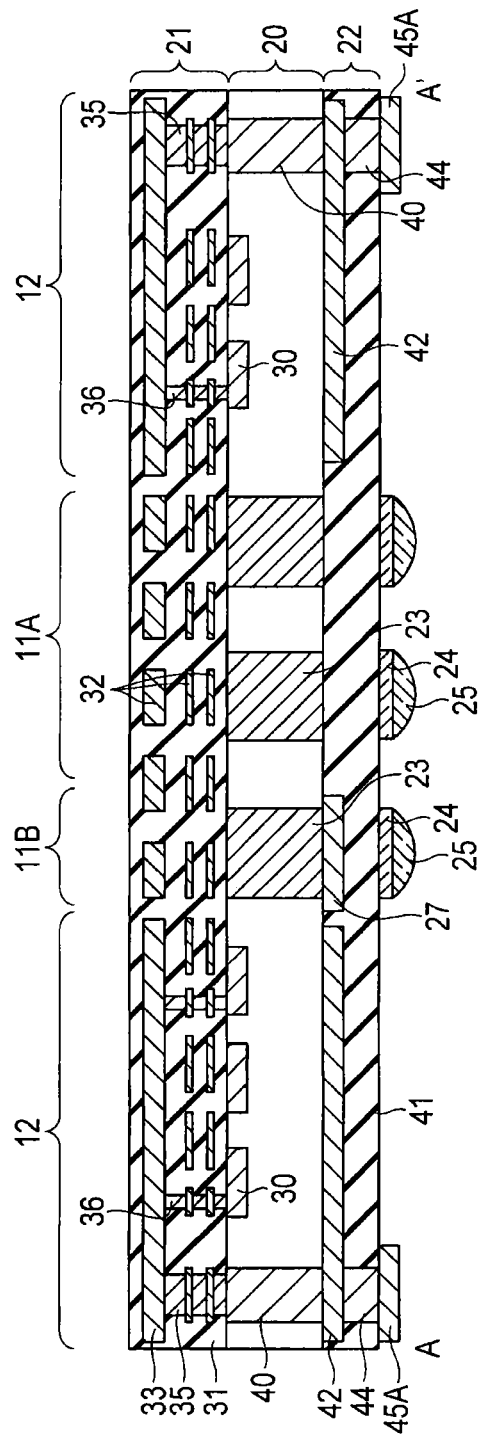
FIG. 15 is a sectional view of the solid-state imaging device taken along line A-A' of FIGS. 13 and 19.
Figure 16:
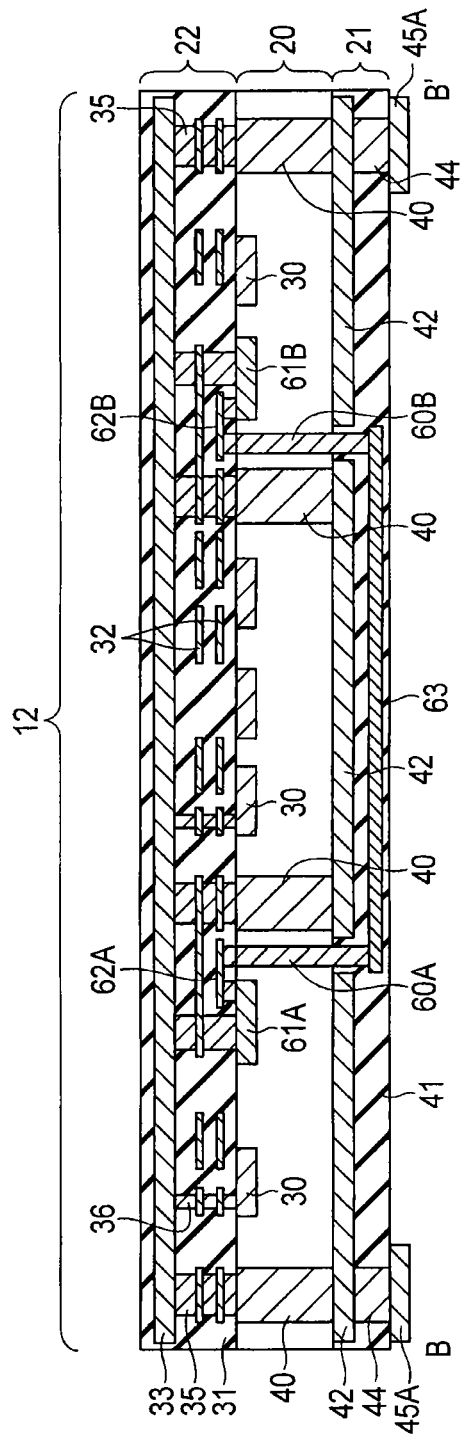
FIG. 16 is a sectional view of the solid-state imaging device taken along line B-B' of FIGS. 13 and 14.

FIG. 13 is a layout of the front side of a solid-state imaging device 10 according to the fourth embodiment. FIG. 14 is a layout of the backside of the solid-state imaging device 10 according to the fourth embodiment. FIG. 15 is a sectional view of the solid-state imaging device 10 taken along line A-A' of FIGS. 13 and 14. FIG. 16 is a sectional view of the solid-state imaging device 10 taken along line B-B' of FIGS. 13 and 14.

In the peripheral circuit area 12 of the fourth embodiment, a backside interconnection layer 22 is provided on the back surface of a semiconductor substrate 20 and includes an interlayer insulating layer (planarization layer) 41 and a multilevel interconnection layer formed in the interlayer insulating layer 41. The backside interconnection layer 22 includes a backside VSS line 42 and a light-shielding film 27 which are formed of a first-level interconnection layer and a plurality of signal lines 63 formed of a second-level interconnection layer. In other words, the backside VSS line 42 is formed of a first-level interconnection layer that is a first layer from the semiconductor substrate 20, and the signal lines 63 are formed of a second-level interconnection layer that is the second layer from the semiconductor substrate 20. The backside VSS line 42 and the signal lines 63 are made of metal having imperviousness to light, such as aluminum (Al) and copper (Cu).

In the optical black area 11B of the fourth embodiment, the light-shielding film 27 is formed to shield light emitted from the backside of the semiconductor substrate 20. The light-shielding film 27 is formed of the same first-level interconnection layer as the backside VSS line 42 and made of the same material as that of the backside VSS line 42.

As illustrated in FIG. 14, the backside VSS line 42 is formed to cover the peripheral circuit area 12 and, in other words, the backside VSS line 42 is formed like, for example, a ring to surround a pixel area 11. The backside VSS line 42 has openings 64A and 64B through which through electrodes 60A and 60B for the signal lines 63 pass. The backside VSS line 42 is a power line for applying power to a MOSFET group 30 and a ground voltage VSS is applied to the backside VSS line 42.

The backside VSS line 42 is electrically connected to the other end of each of a plurality of through electrodes 40 and also electrically connected to a front side VSS line 33 via the through electrodes 40. It is desirable that the through electrodes 40 connected to the backside VSS line 42 should be evenly arranged on the plane of the backside VSS line 42. As shown in FIG. 14, the backside VSS line 42 is connected to the through electrodes 40 in both end portions of the peripheral circuit area 12 in the Y direction and in the middle portion of the peripheral circuit area 12. Furthermore, the backside VSS line 42 is electrically connected to a VSS pad 45A provided on the backside interconnection layer 22 through a via plug 44.

In the peripheral circuit area 12, the signal lines 63 are arranged to extend in the Y direction, for example. One end of each of the signal lines 63 is connected to the through electrode 60A that passes through the semiconductor substrate 20 and the other end thereof is connected to the through electrode 60B that passes through the semiconductor substrate 20. The through electrode 60A is connected to one end of a current path of a driver MOSFET 61A through a connecting portion 62A. The other end of the current path of the driver MOSFET 61A is connected to, for example, the front side VSS line 33. The through electrode 60B is connected to one end of a current path of a receiver MOSFET 61B through a connecting portion 62B. The other end of the current path of the receiver MOSFET 61B is connected to the front side VSS line 33, for example.

The driver MOSFET 61A and receiver MOSFET 61B are arranged in the peripheral circuit area 12. The driver MOSFET 61A drives the signal lines 63 and the receiver MOSFET 61B receives signals from the signal lines 63. The through electrodes 60A and 60B for the signal lines 63 are arranged near the driver MOSFET 61A and receiver MOSFET 61B, respectively. It is desirable that the through electrode 40 for the VSS line and the driver MOSFET 61A should be connected to each other in the shortest distance and the through electrode 40 for the VSS line and the receiver MOSFET 61B should be connected to each other in the shortest distance.

(Advantage)

As described in detail above, according to the fourth embodiment, a signal line from which a malfunction is very likely to occur due to noise is formed on the back surface of the substrate which is distant from the MOSFET group on the front surface of the substrate from which the noise is generated. Moreover, the backside VSS line 42 is formed between the backside signal lines 63 and the MOSFET group to shield noise from the MOSFET group. Accordingly, the influence of noise generated from the MOSFET group on a signal line from which a malfunction is very likely to occur due to the noise, can greatly be reduced.

The through electrodes 60A and 60B for the signal lines 63 are arranged near the through electrodes 40 for the VSS line. Thus, the VSS line is formed along the signal line from the driver MOSFET 61A to the receiver MOSFET 61B, and the feedback current of the signal lines flow through the VSS line. Therefore, signal transmission is stabilized and the influence of noise from an external device can be reduced.

The backside VSS line 42 covers the entire peripheral circuit area 12 to shield light incident upon the peripheral circuit area 12 from the backside of the substrate. Therefore, an excitation current due to light can be prevented from being generated to stabilize a circuit operation and reduce a leakage current.

Fifth Embodiment

The fifth embodiment differs from the fourth embodiment in the shape of the backside VSS line. In the fifth embodiment, a VSS line for applying power to a driver MOSFET and a receiver MOSFET is separated from a VSS line for applying power to the other semiconductor elements.

Figure 18:
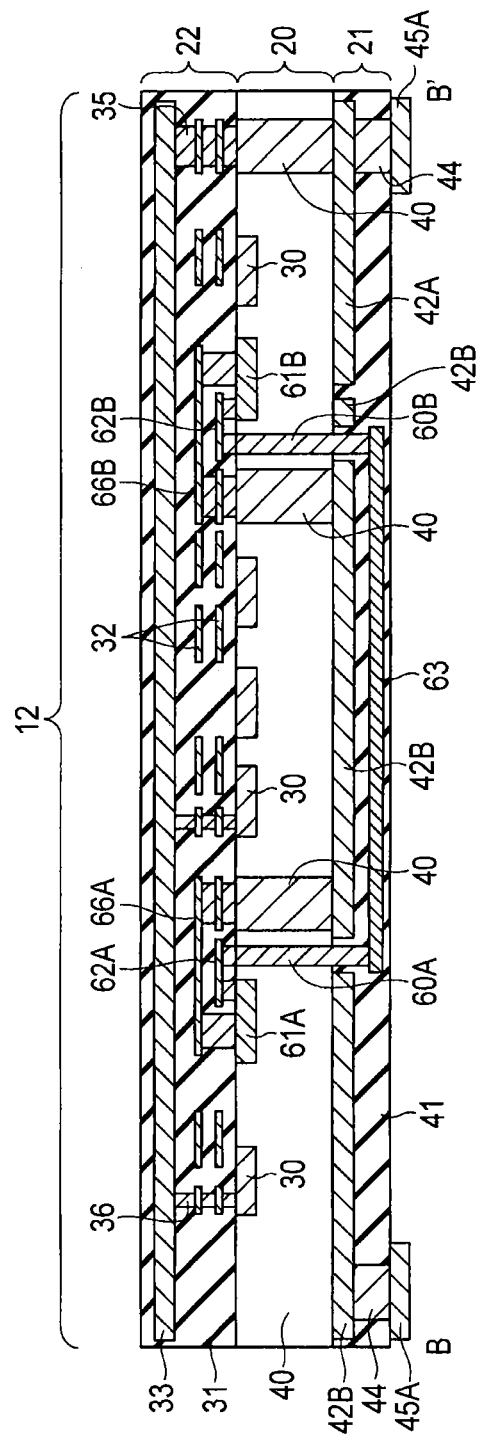
FIG. 18 is a sectional view of the solid-state imaging device taken along line B-B' of FIG. 17.

FIG. 17 is a layout of the backside of a solid-state imaging device 10 according to the fifth embodiment. FIG. 18 is a sectional view of the solid-state imaging device 10 taken along line B-B' of FIG. 17.

The backside interconnection layer 22 of the fifth embodiment includes a first-level interconnection layer (backside VSS line). The first-level interconnection layer includes a backside VSS line 42A for applying power to the entire peripheral circuit and a backside VSS line 42B for applying power to a driver MOSFET 61A and a receiver MOSFET 61B for a signal line 63. In the fifth embodiment, the backside VSS line 42 of the fourth embodiment is separated into a backside VSS line 42A and a backside VSS line 42B.

The backside VSS line 42B is formed along the signal lines 63 and between the signal lines 63 and semiconductor substrate 20. If two or more signal lines 63 are formed, a slit 65 is provided between VSS lines formed along the signal lines 63. The backside VSS line 42B is connected to a dedicated VSS pad 45A through a via plug 44.

One end of a current path of the driver MOSFET 61A is connected to the backside VSS line 42B via a connecting portion 66A and a through electrode 40. One end of a current path of the receiver MOSFET 61B is connected to the backside VSS line 42B via a connecting portion 66B and a through electrode 40.

According to the fifth embodiment, the influence of the backside VSS line 42A upon the signal line 63 from which noise is generated can greatly be reduced, in addition to the advantage of the fourth embodiment. If a slit 65 is provided between the VSS lines 428 formed along a plurality of signal lines 63, crosstalk of the signal lines 63 can be reduced. As a result, the signal lines are more hardly influenced by noise and the circuit operation can be prevented from malfunctioning due to noise.

Sixth Embodiment

Unlike in the fifth embodiment, in the sixth embodiment, the shape of the signal line 63 is modified and a light-shielding film for shielding light from the slit of the backside VSS line is added.

Figure 19:
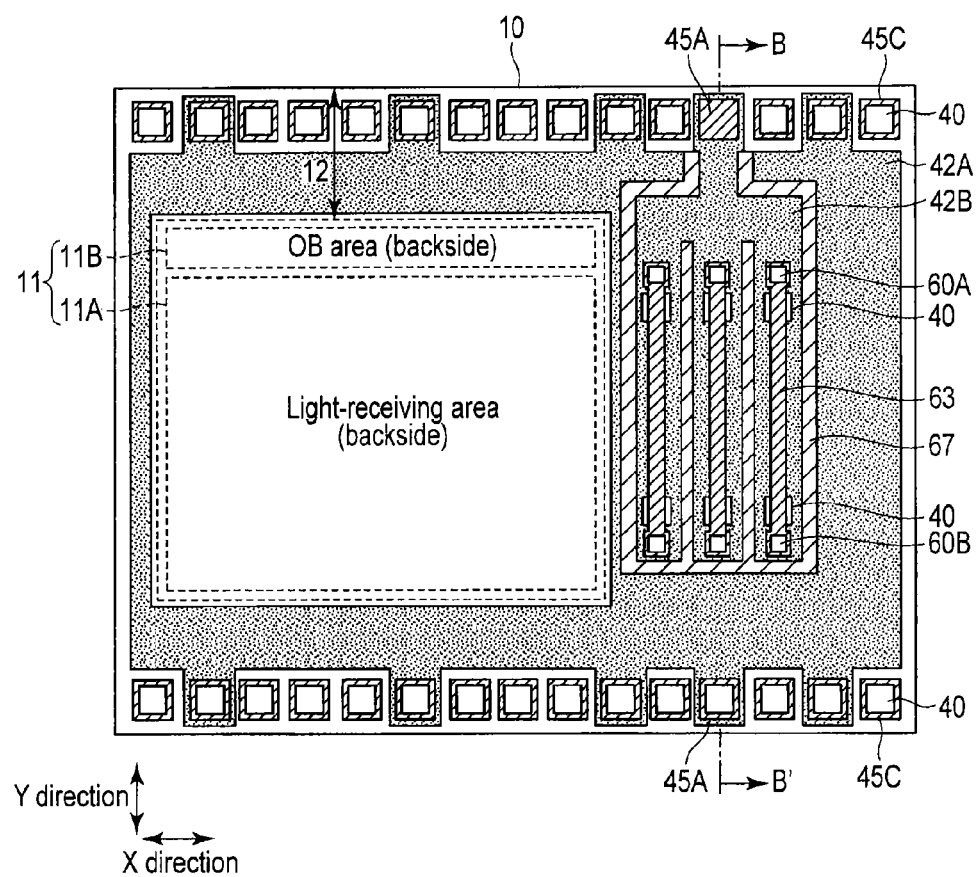
FIG. 19 is a layout of the backside of a solid-state imaging device according to a sixth embodiment.
Figure 20:
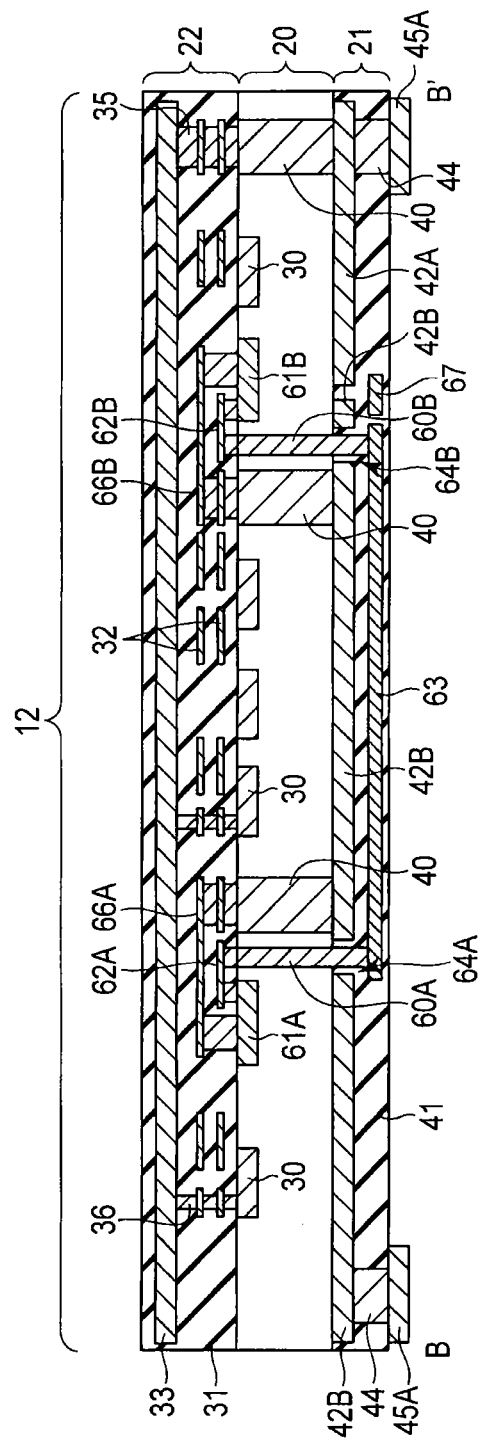
FIG. 20 is a sectional view of the solid-state imaging device taken along line B-B' of FIG. 19.

FIG. 19 is a layout of the backside of a solid-state imaging device 10 according to the sixth embodiment. FIG. 20 is a sectional view of the solid-state imaging device 10 taken along line B-B' of FIG. 19.

The signal line 63 is increased in area in the portions where it is connected to through electrodes 60A and 60B such that the through electrodes 60A and 60B cover their respective openings 64A and 64B through which the through electrodes 60A and 60B pass. Furthermore, a light-shielding film 67 is provided above a slit between backside VSS lines 42A and 42B and a slit formed in the backside VSS line 42B in order to cover the slits. The light-shielding film 67 is formed of a backside second-level interconnection layer and made of the same metal having imperviousness to light as that of the signal line 63. The light-shielding film 67 need not be connected to another line but can electrically be connected to a VSS line.

According to the sixth embodiment, the light-shielding film 67 can shield a gap between the backside VSS line 42B and the through electrodes 60A and 60B for signal lines, a gap between the backside VSS lines 42A and 42B from light, and a gap formed in the backside VSS line 42B. Thus, in addition to the fifth embodiment, the peripheral circuit area 12 can be shielded from light more reliably to stabilize a circuit operation and reduce a leakage current.

Seventh Embodiment

Unlike in the fifth embodiment, in the seventh embodiment, the shape of the through electrodes for the VSS line, which are provided near the through electrodes 60A and 60B for the signal line 63, is modified and the signal line 63 is shielded by a shield line formed of a backside second-level interconnection layer.

Figure 21:
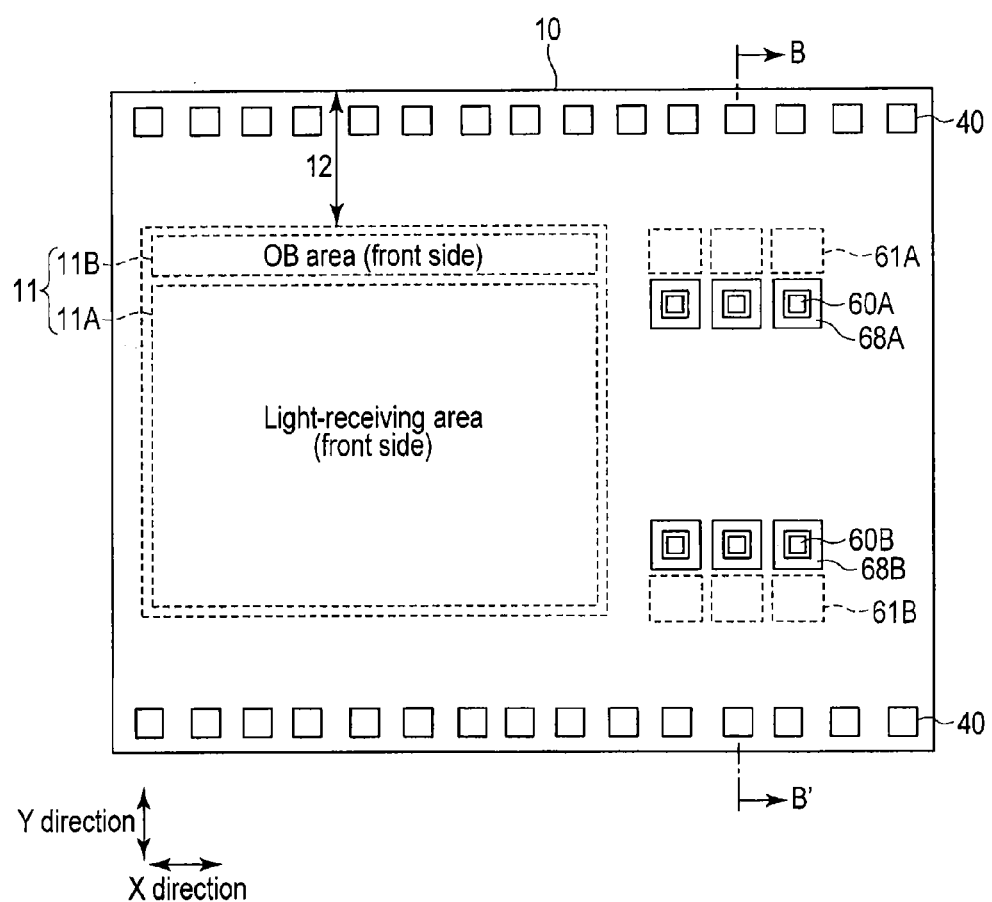
FIG. 21 is a layout of the front side of a solid-state imaging device according to a seventh embodiment.
Figure 23:
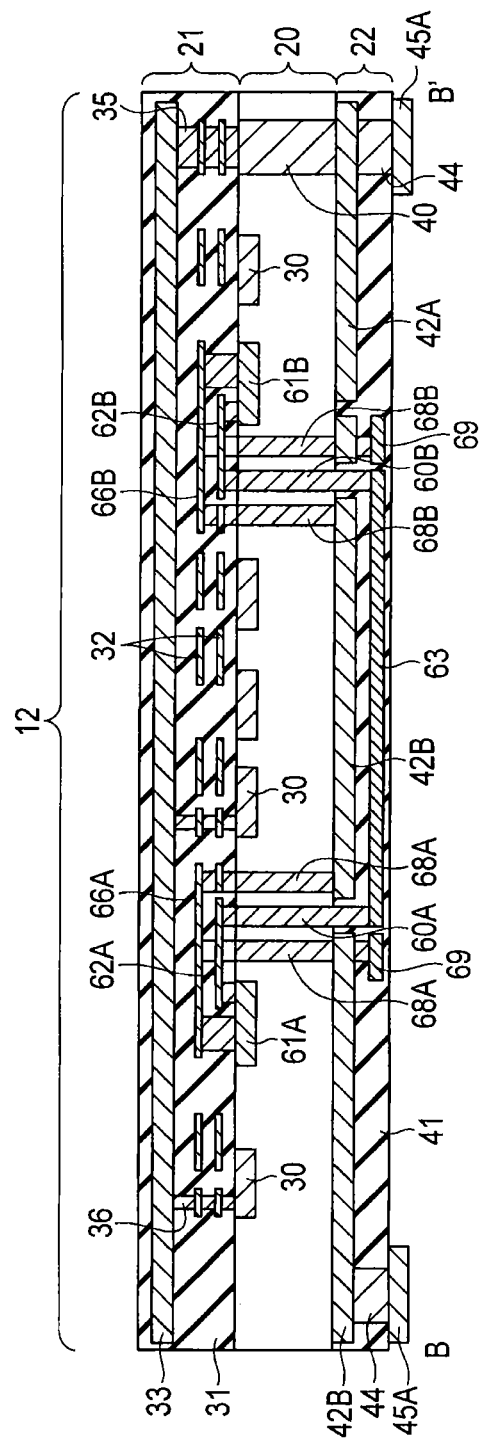
FIG. 23 is a sectional view of the solid-state imaging device taken along line B-B' of FIGS. 21 and 22.

FIG. 21 is a layout of the front side of a solid-state imaging device 10 according to the seventh embodiment. FIG. 22 is a layout of the backside of the solid-state imaging device 10. FIG. 23 is a sectional view of the solid-state imaging device 10 taken along line B-B' of FIGS. 21 and 22. FIG. 24 is a sectional view of the solid-state imaging device 10 taken along line C-C' of FIG. 22.

A through electrode 68A that passes through a semiconductor substrate 20 is provided near the through electrode 60A for the signal line 63 to surround the through electrode 60A. One end of the through electrode 68A is connected to one end of a current path of a driver MOSFET 61A through a connecting portion 66A and the other end thereof is connected to a backside VSS line 42B.

Likewise, a through electrode 68B that passes through the semiconductor substrate 20 is provided near the through electrode 60B for the signal line 63 to surround the through electrode 60B. One end of the through electrode 68B is connected to one end of a current path of a receiver MOSFET 61B through a connecting portion 66B and the other end thereof is connected to the backside VSS line 42B.

A shield line 69 that is formed of the same backside second-level interconnection layer as the signal line 63 is provided around the signal line 63. The shield line 69 is electrically connected to the backside VSS line 42B and made of the same material as that of the signal line 63.

According to the seventh embodiment, the signal line 63 and the through electrodes 60A and 60B are shielded by shield lines (shield line 69 and through electrodes 68A and 68B) to which a ground voltage VSS is applied, in addition to the advantage of the fifth embodiment. Thus, noise applied to the signal line 63 can be reduced, with the result that the signal line is more hardly influenced by noise and a circuit operation can be prevented from malfunctioning due to the noise.

The fourth to seventh embodiments are directed to a signal line that connects two MOSFETs. As shown in, for example, FIG. 25, however, a backside signal line can be applied to the signal line that connects an external input/output terminal (signal pad 45C) and a MOSFET. In this modification, one end of the signal line 63 is connected to the signal pad 45C through a via plug.

The fourth to seventh embodiments are also directed to a line-shaped signal line having no branches. As shown in, for example, FIG. 26, however, the signal line 63 can branch into a plurality of lines. In this modification, the lines of the signal line 63 are connected to a semiconductor element on the front surface of the substrate via a through electrode 60 that passes through an opening 64.

In the above embodiments, the backside interconnection layer includes two layers. However, the present invention is not limited to this but it can include three or more layers.

In the above embodiments, the electrode pads (VSS pads, VDD pads and signal pads) are provided on the opposing two sides of the rectangular semiconductor substrate. However, the present invention is not limited to this but they can be provided on all of the four sides of the substrate.

In the above embodiments, the power lines and/or signal lines can be applied to a semiconductor device (semiconductor integrated circuit) other than the solid-state imaging device.

[Application Example]

Figure 27:
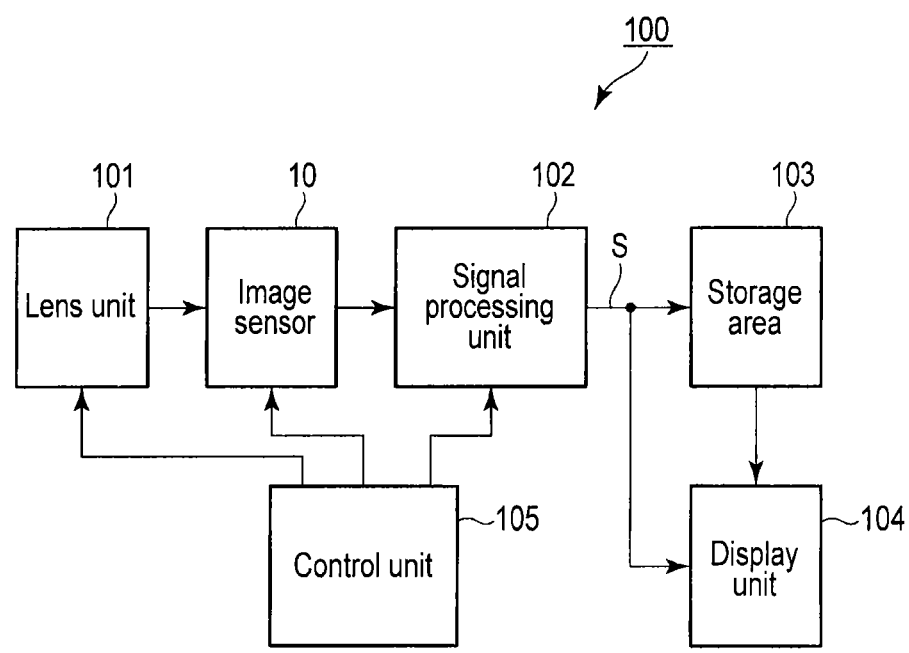
FIG. 27 is a block diagram of a digital camera using the solid-state imaging device according to each of the first to seventh embodiments.

The solid state imaging device 10 described in each of the above embodiments is applicable to a digital camera or various electronic devices equipped with a camera such as a cellular phone with camera. FIG. 27 is a block diagram of a digital camera 100 using the solid state imaging device 10 according to the embodiment.

The digital camera 100 comprises a lens unit 101, the solid state imaging device (image sensor) 10, a signal processing unit 102, a storage unit 103, a display unit 104, and a control unit 105.

The lens unit 101 includes a plurality of imaging lenses, and mechanically or electrically controls the optical characteristics (for example, focal length) for incident light. The light that has passed through the lens unit 101 forms an image on the image sensor 10. An electrical signal output from the image sensor 10 is processed by the signal processing unit 102. The signal processing unit 102 is formed from a digital signal processor (DSP) or the like. A signal S from the signal processing unit 102 is output to the display unit 104 or output to the display unit 104 via the storage unit 103. The image that is captured or being captured is thus displayed on the display unit 104. The control unit 105 controls the operation of the entire digital camera 100, and also controls the operation timings of the lens unit 101, the image sensor 10, and the signal processing unit 102.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A solid-state imaging device comprising:
 a semiconductor substrate including a pixel area and a peripheral circuit area and having a first principal surface and a second principal surface;
 an interconnection structure provided on the first principal surface of the semiconductor substrate and including first interconnection layers electrically connected to the peripheral circuit area;

a second interconnection layer provided in the peripheral circuit area and on the second principal surface of the semiconductor substrate;

a third interconnection layer provided above the second interconnection layer with an insulating layer therebetween; and through electrodes electrically connecting the second interconnection layer to the third interconnection layer and passing through the semiconductor substrate.

2. The device of claim 1, wherein the through electrodes include a first through electrode and a second through electrode, the first through electrode electrically connects the second interconnection layer to the interconnection structure and passes through the semiconductor substrate, and the second through electrode electrically connects the third interconnection layer to the interconnection structure and passes through the semiconductor substrate.

3. The device of claim 2, wherein the second interconnection layer is a power line and is formed in the peripheral circuit area in a planar manner, and the third interconnection layer is a signal line.

4. The device of claim 3, wherein the first through electrode is provided near the second through electrode.

5. The device of claim 4, wherein the first through electrode is formed to surround the second through electrode.

6. The device of claim 3, further comprising a shield line formed to surround the third interconnection layer, wherein the shield line is electrically connected to the second interconnection layer.

7. The device of claim 1, wherein the second and third interconnection layers are each formed in the peripheral circuit area in a planar manner.

8. The device of claim 1, further comprising a via plug electrically connecting the second interconnection layer to the third interconnection layer.

9. The device of claim 1, wherein the second interconnection layer includes first interconnection portions separated by a slit, and the third interconnection layer includes second interconnection portions separated by a slit.

10. The device of claim 9, wherein the slit of the third interconnection layer differs in location from the slit of the second interconnection layer in a planar view.

11. The device of claim 9, wherein the second and third interconnection layers are formed to cover the peripheral circuit area.

12. The device of claim 1, wherein the second and third interconnection layers are made of a light-shielding material.

13. The device of claim 1, further comprising a light-shielding film formed in part of the pixel area and on the second principal surface of the semiconductor substrate, wherein the second and third interconnection layers are made of a same material as that of the light-shielding film.

14. The device of claim 1, wherein each of the second and third interconnection layers is one of a power line and a signal line.

15. The device of claim 1, further comprising light-receiving elements provided in the pixel area and on the second principal surface of the semiconductor substrate.

* * * * *